United States Patent [19]

Krilic

[11] Patent Number: 5,029,140
[45] Date of Patent: Jul. 2, 1991

[54] DYNAMIC MEMORY CELL

[76] Inventor: Goran Krilic, Pljesivicka 48, 41040 Zagreb, Yugoslavia

[21] Appl. No.: 437,378

[22] Filed: Nov. 15, 1989

[30] Foreign Application Priority Data

Nov. 21, 1988 [GB] United Kingdom ............. 8827130.9

[51] Int. Cl.$^5$ ..................... G11C 7/00; G11C 11/24
[52] U.S. Cl. ..................................... 365/222; 365/149
[58] Field of Search ............. 365/149, 150, 222, 228

[56] References Cited

U.S. PATENT DOCUMENTS

| | | | |
|---|---|---|---|
| 3,618,053 | 11/1971 | Hudson | 365/150 |
| 3,955,181 | 5/1976 | Raymond, Jr. | 365/222 |
| 4,037,243 | 7/1977 | Hoffman et al. | 365/150 |
| 4,112,510 | 9/1978 | Baker | 365/222 |
| 4,161,791 | 7/1979 | Leach | 365/222 |
| 4,682,306 | 7/1987 | Sakurai et al. | 365/222 |

Primary Examiner—Stuart N. Hecker
Assistant Examiner—Jack A. Lane

[57] ABSTRACT

A self-refreshing dynamic memory cell comprises a first MOSFET and a first capacitor forming a classical dynamic memory cell, a first diode connected with the power supply and the first capacitor, which is under small reverse voltage when the first capacitor is slightly discharged due to a leakage currently and in which reverse current compensates leakage current since it flows in opposite direction, together with additional circuit means which compensates unwanted reverse current through the first diode when the first capacitor is coupled to a positive voltage through the first MOSFET and which tends to charge the first capacitor and change the stored data.

4 Claims, 2 Drawing Sheets

DYNAMIC MEMORY CELL

BACKGROUND OF THE INVENTION

Dynamic memory cells wherein data is capacitatively stored and in consequence periodic refreshing is required are in themselves well known. Refreshing presents a problem in relation to writing into or reading from the memory, since complex additional external circuitry such as an arbiter is necessary to separate the functions.

OBJECT OF THE INVENTION

It is a principal object of this invention to provide a dynamic memory cell which provides self-refreshing without the use of complex additional external circuitry.

It is a further object of the invention to provide a memory cell which avoids the disadvantageous points of both static and dynamic cells whilst incorporating their main advantages. More especially, the invention aims to provide the advantages over the classical dynamic cell of flexibility and greater ease of use, since there are no refreshing problems and the advantages over the static cell of greater simplicity and much less power dissipation. Furthermore, it is a further aim to ensure that data is not lost immediately after a power supply failure, which thus eases battery back-up functions.

BRIEF SUMMARY OF THE INVENTION

According to the invention there is provided a dynamic memory cell comprising a first MOSFET transistor, a first capacitor so connected electrically with the source of the first MOSFET as to become subject to an increasing or decreasing voltage when the gate and drain of the first MOSFET are addressed dependent on the mode of addressing the gate and drain and on the existing voltage on the first capacitor, and a first diode which is so connected electrically with the first capacitor and the power supply as to become subject to a small reverse voltage, resulting in a small reverse current which compensates leakage current and thus performs refreshing, when the first capacitor is coupled to a positive voltage through the first MOSFET and thus when logical "1" is stored, together with additional circuit means which compensates unwanted reverse current through the first diode when the first capacitor is coupled to a zero voltage through the first MOSFET, comprising a second MOSFET transistor, a third MOSFET transistor, a second diode and a second capacitor constituting a gate-source capacitance for the second MOSFET, which is normally, when the first capacitor is coupled to a zero voltage through the first MOSFET and when logical "0" is stored, charged substantially to the power supply voltage due to the large reverse current of the second diode which is connected electrically to the power supply, the second capacitor becoming subject to a decreasing reverse voltage until the second capacitor is charged substantially to the power supply voltage, which will occur before said unwanted reverse current of the first diode, which, being much smaller than the reverse current of the second diode, significantly charges the first capacitor, whereby when the first capacitor is coupled to a zero voltage through the first MOSFET, the third MOSFET transistor, having its gate is connected with the first capacitor, its drain with the second capacitor and its source grounded, will be unable to discharge the second capacitor and as a consequence the gate of the second MOSFET transistor, which has its gate connected with the second capacitor and its drain with the first capacitor and its source with ground, and will thereby carry a voltage substantially equal to the power supply voltage, which thus enables the second MOSFET transistor to discharge the first capacitor, which is charging due to the unwanted but existing small reverse current of the first diode, since charging the first capacitor increases the drain voltage of the second MOSFET transistor, and contrariwise when the first capacitor is coupled to a positive voltage through the first MOSFET, the third MOSFET transistor is rapidly discharging the second capacitor to zero voltage whilst the second MOSFET transistor is ineffective and unable to discharge the first capacitor, and consequently the date is preserved and subject to refreshing.

BRIEF DESCRIPTION OF DRAWINGS

In the accompanying drawings.

DESCRIPTION OF THE EMBODIMENTS

Figure 1:
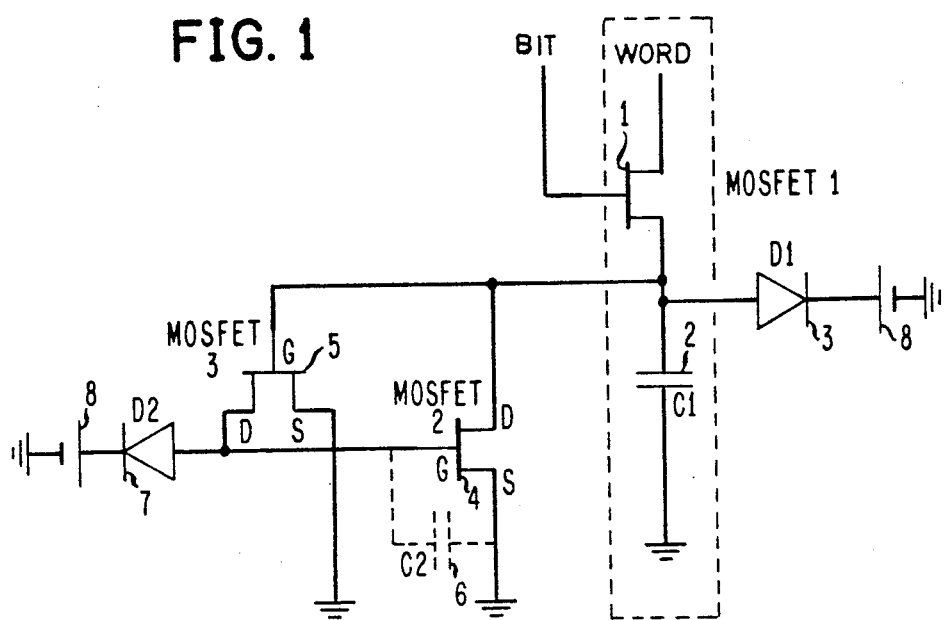
FIG. 1 shows a self-refreshing dynamic memory cell.

Referring to FIG. 1, a self-refreshable dynamic memory cell in accordance with the invention comprises a first MOSFET referenced 1 and a first capacitor referenced 2, forming a classical dynamic memory cell, and an additional circuit means consisting of a second MOSFET referenced 4, a third MOSFET referenced 5, a second capacitor referenced 6, a first diode referenced 3, a second diode referenced 7 and a power supply referenced 8. As above-mentioned, the first MOSFET and the first capacitor are connected in series and form a classical dynamic memory call. The first diode is connected with the power supply and the first capacitor, which is under small reverse voltage when the first capacitor is slightly discharged due to a leakage, and in which a reverse current compensates leakage current since it flows in the opposite direction.

Said additional circuit means compensates unwanted reverse current through the first diode when the first capacitor is coupled to a zero voltage. The second capacitor is, when the first capacitor is coupled to a zero voltage through the first MOSFET, and thus when logical "0" is stored, charged substantially to the power supply voltage, due to the deliberately large reverse current of the second diode referenced 7 (which has, for example, a large surface area or a different current-voltage characteristic to produce large reverse current), which is connected to the power supply and the second capacitor to become subject to a decreasing reverse voltage until the second capacitor is charged substantially to the power supply voltage. This will occur before said unwanted reverse current of the first diode, which is much smaller than the reverse current of the second diode, charges the first capacitor to a threshold voltage of the third MOSFET.

Consequently, when the first capacitor is coupled to a zero voltage through the first MOSFET the third MOSFET referenced 5, having its gate connected with the first capacitor, its drain with the second capacitor and its source with ground referenced 13, will be ineffective and thus unable to discharge the second capacitor.

As a consequence the gate of the second MOSFET, which has its gate connected with the second capacitor, its drain with the first capacitor and its source with ground, will have a voltage substantially equal to the power supply voltage. This enables the second MOSFET to discharge the first capacitor, which is charging due to the unwanted but existing small reverse current of the first diode, because charging the first capacitor increases the drain voltage of the second MOSFET (see current-voltage characteristic of FIG. 3).

Contrariwise, when the first capacitor is coupled to a positive voltage, through the first MOSFET, the third MOSFET will rapidly discharge the second capacitor to zero voltage. Consequently, the second MOSFET will be ineffective and unable to discharge the first capacitor, thereby permitting refreshing.

Figure 3:
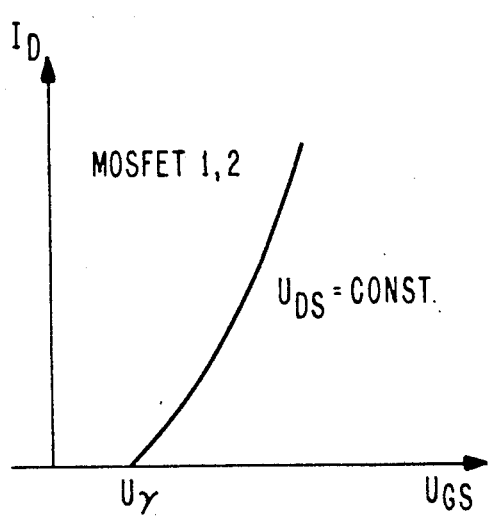
FIG. 3 shows current-voltage characteristics of the MOSFETs.
Figure 3:
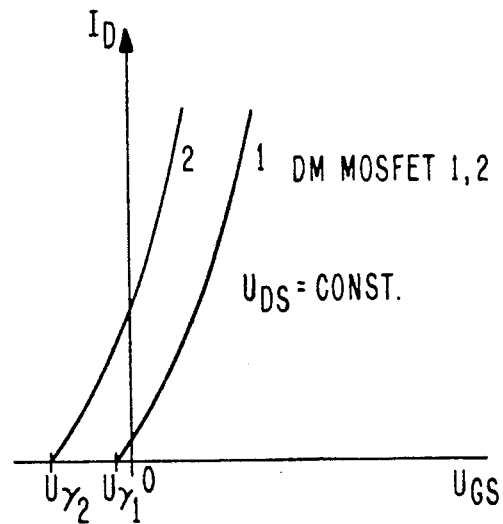
Figure 3:
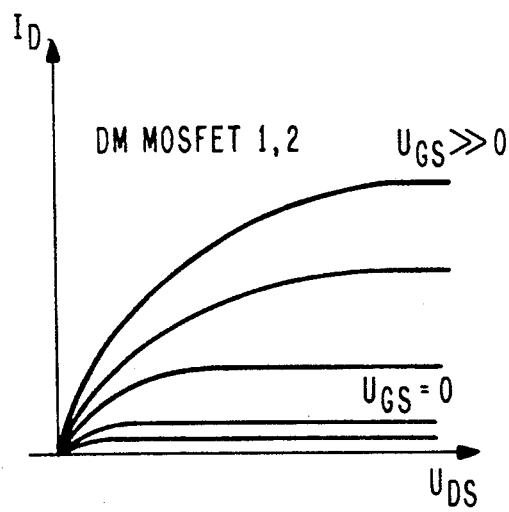
Figure 3:
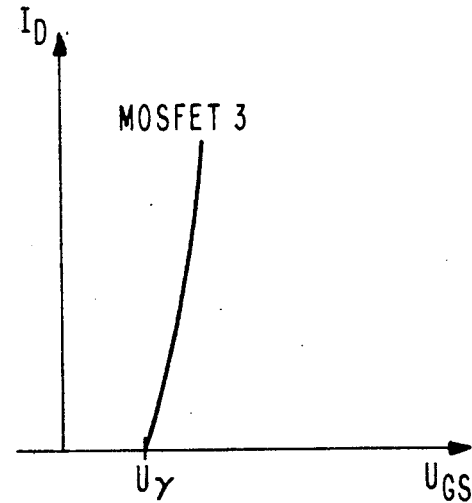

It is desirable that the third MOSFET has very abrupt current-voltage characteristic after a threshold (see FIG. 3). When logical "0" is stored and logical "1" (the first capacitor C1 charged) is to be written, the second MOSFET (although it draws smaller current) tends to discharge the first capacitor being charged by the first MOSFET. The third MOSFET, after the first capacitor is charged to its threshold by MOSFET 1, rapidly discharges the second capacitor C2 and blocks MOSFET 2. It thus enables the first capacitor to be fully charged during the writing cycle.

Achievement of the current-voltage characteristics of FIG. 3 is technologically not a problem since the characteristics of transistors can be precisely determined by the standard technology of ion implantation. However, if the first capacitor (storage capacitor) is much larger than the second capacitor, all the MOSFETs may have identical current-voltage characteristics and likewise both diodes. Most current dynamic RAMs incorporate high storage cell capacitance to provide wide internal device margins, for reduce noise sensitivities, more reliable system operation, and a low soft error rate, without the need for a die coat.

The first and the second diodes may be replaced with depletion mode MOSFETs (see FIG. 2), which operate at zero voltage between gate and source (see FIG. 3). The first depletion mode DM MOSFET referenced 9 is connected with the power supply and the first capacitor. Its drain is connected with the power supply whilst its gate and source are connected with the first capacitor. The second DM MOSFET referenced 10 is connected with the power supply and the second capacitor. Its drain is connected with the power supply while its gate and source are connected with the second capacitor. They perform the same function as said diodes. If the first and second capacitor have the same capacitances, it is necessary that DM MOSFET 2 has a larger negative voltage threshold than DM MOSFET 1 (see current-voltage characteristic of FIG. 3).

In series with but electrically opposite in sense with the first and second diode, or the first and second DM MOSFETs, two diodes may be connected in order to prevent the first and the second capacitor being discharged immediately after a power supply failure occurs. This makes for easier switching to a battery back-up operation.

The above-described memory cell dissipates minimum power because MOSFETs are continually in a minimum current mode. The current, which continuously flows, is of the order of magnitude of the leakage current. This is a clear and significant advantage over a static cell, and enables high packing density, since the power dissipation, rather than technology, is the limiting factor.

Figure 2:
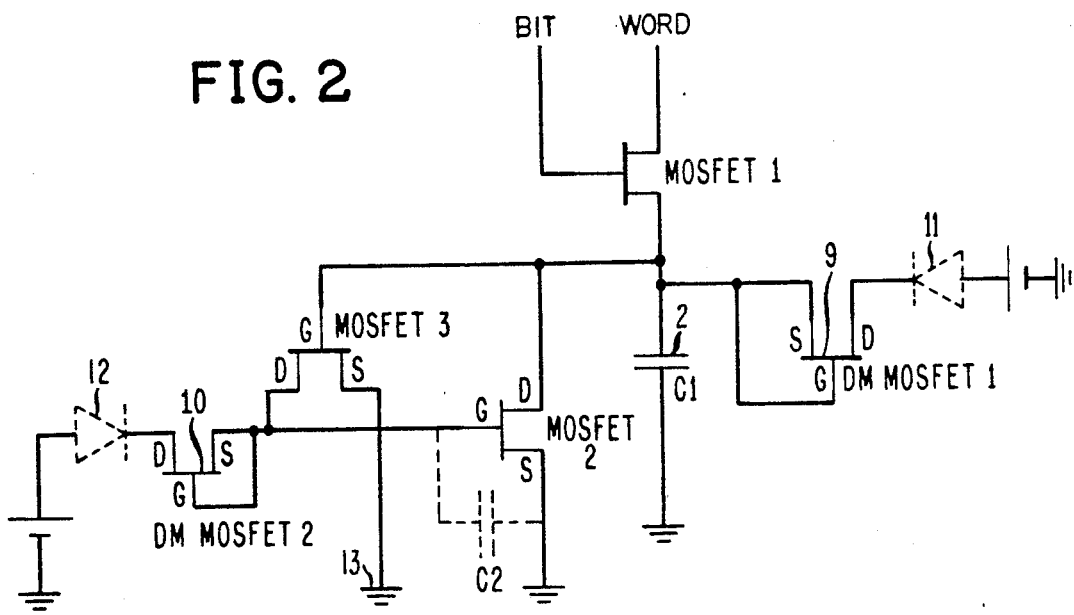
FIG. 2 shows a modified version of the memory cell.

The self-refreshable dynamic memory cell as shown in FIG. 2 may be technologically preferred because it involves NMOS technology exclusively (no additional PN junctions). The type (depletion or enhancement mode) of NMOSFETs and their characteristics may be precisely and easily achieved using standard NMOS technology, being dependent on the energy and dose at which the dopant atoms are implanted into a wafer.

I claim:

1. A self-refreshing dynamic memory cell consisting of a first MOSFET transistor and a first capacitor connected electrically in series and forming a classical dynamic memory cell and a first diode electrically connecting a power supply to the first capacitor, said diode being under a small reverse voltage when the first capacitor is slightly discharged due to a leakage current and in which reverse current compensates said leakage current since it flows in the opposite direction, and an additional circuit means, in which compensates for unwanted reverse current through the first diode when the first capacitor is coupled to a zero voltage through said first MOSFET, comprising a second MOSFET transistor, a third MOSFET transistor, a second diode and a second capacitor, being a gate-source capacitance for the second MOSFET, which is normally, when the first capacitor is coupled to a zero voltage through said first MOSFET and when logical "0" is stored, charged substantially to the power supply voltage due to the large reverse current of the second diode, which is electrically connecting a power supply and the second capacitor to become subject to a decreasing reverse voltage until the second capacitor is charged substantially to the power supply voltage, which will occur before said unwanted reverse current of the first diode and, being much smaller than the reverse current of the second diode, significantly charges the first capacitor, whereby when the first capacitor is coupled to a zero voltage through said first MOSFET the third MOSFET transistor, which has its gate connected with the first capacitor, its drain with the second capacitor and its source grounded, will be unable to discharge the second capacitor and as a consequence the gate of the second MOSFET transistor, which has its gate connected with the second capacitor, its drain with the first capacitor and its source grounded, and will thereby carry a positive voltage substantially equal to the power supply voltage, which thus enables the second MOSFET transistor to discharge the first capacitor, which is charging due to the unwanted but existing small reverse current of the first diode, since charging the first capacitor increases the drain voltage of the second MOSFET transistor, and contrariwise when the first capacitor is coupled to a positive voltage through said first MOSFET the third MOSFET transistor is rapidly discharging the second capacitor to zero voltage whilst causing the second MOSFET transistor to be ineffective and unable to discharge the first capacitor, and consequently the data is preserved and subject to refreshing.

2. The memory cell of claim 1, wherein the first and the second diode are replaced with depletion mode MOSFET transistors which operate at zero voltage between the gate and the source, the first depletion mode MOSFET transistor being connected electrically with the power supply and the first capacitor in such a manner that its drain is connected electrically with the power supply while its gate and source are connected electrically with the first capacitor, and the second depletion mode MOSFET transistor is connected electrically with the power supply and the second capacitor in such a manner that its drain is connected electrically with the power supply while its gate and source are connected electrically with the second capacitor, the depletion mode MOSFETs performing the same function as said diodes.

3. The memory cell of claim 1, wherein in series but electrically opposite in sense with the first and second diodes, two diodes are connected electrically in order to prevent the first and the second capacitors from being discharged immediately after a power supply failure.

4. The memory cell of claim 2, wherein in series but electrically opposite in sense with the depletion mode MOSFETs, two diodes are electrically connected in order to prevent the first and second capacitors being discharged immediately after a power supply failure.

* * * * *